United States Patent
Schröder et al.

(10) Patent No.: US 8,132,304 B2
(45) Date of Patent: Mar. 13, 2012

(54) METHOD OF MANUFACTURING A PIEZOELECTRIC ACTUATOR

(75) Inventors: Martin Schröder, Donaustauf (DE); Manfred Weigl, Viehhausen (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/954,245

(22) Filed: Nov. 24, 2010

(65) Prior Publication Data

US 2011/0062830 A1     Mar. 17, 2011

Related U.S. Application Data

(63) Continuation of application No. 12/091,415, filed as application No. PCT/EP2006/067612 on Oct. 20, 2006, now abandoned.

(30) Foreign Application Priority Data

Oct. 26, 2005   (DE) .......................... 10 2005 051 289

(51) Int. Cl.
    *H04R 17/10*   (2006.01)
    *H05K 3/28*    (2006.01)

(52) U.S. Cl. ............. 29/25.35; 29/830; 29/846; 29/851; 310/328; 310/365; 310/366

(58) Field of Classification Search ............... 29/25.35, 29/830, 831, 846, 851; 310/328, 365, 366; 524/492; 156/206
    See application file for complete search history.

(56) References Cited

U.S. PATENT DOCUMENTS

| 4,903,166 | A  | 2/1990 | Galvagni ..................... 361/321 |
| 6,260,248 | B1 | 7/2001 | Cramer et al. ............... 29/25.35 |
| 6,399,677 | B2 * | 6/2002 | Tomiyoshi et al. ....... 524/492 X |
| 6,414,417 | B1 | 7/2002 | Tsuyoshi et al. .............. 310/366 |
| 6,700,311 | B2 | 3/2004 | Hammer et al. .............. 310/363 |
| 7,304,414 | B2 | 12/2007 | Florian et al. ................ 310/328 |
| 7,323,807 | B2 | 1/2008 | Sasaki ........................... 310/366 |
| 2002/0084019 | A1 * | 7/2002 | Date et al. ..................... 156/206 |
| 2004/0178701 | A1 * | 9/2004 | Sato et al. ..................... 310/328 |
| 2005/0236933 | A1 * | 10/2005 | Florian et al. ................. 310/328 |

(Continued)

FOREIGN PATENT DOCUMENTS

DE        3940619        12/1990

(Continued)

OTHER PUBLICATIONS

European Office Action for Application No. 06 807 430.1 (3 pages), Mar. 22, 2010.

(Continued)

*Primary Examiner* — A. Dexter Tugbang
(74) *Attorney, Agent, or Firm* — King & Spalding L.L.P.

(57) ABSTRACT

A method for producing a piezoelectric actuator has the following steps: providing a plurality of piezoelectric material layers (2) which can be assembled into a stack; applying electrode layers (3) each having a recess (4, 4') to the plurality of piezoelectric material layers, such that an alternating sequence of piezoelectric material layers and electrode layers is formed in the stack, wherein electrode layers with a recess (4) in a first recess zone and electrode layers with a recess (4') in a second recess zone which differs from the first recess zone are alternatingly formed in the stack; and providing a stress-relieving material (5) in the first and second recesses, the stress-relieving material exhibiting electrically insulating properties after the stack is sintered, and preventing the individual material layers from adhering to one another.

6 Claims, 2 Drawing Sheets

U.S. PATENT DOCUMENTS

2010/0013359 A1    1/2010    Shoji et al. .................. 310/366

FOREIGN PATENT DOCUMENTS

| DE | 19615694 | 7/1997 | | |
|---|---|---|---|---|
| DE | 10006352 | 8/2001 | | |
| DE | 10320161 | 3/2004 | | |
| EP | 0894340 | 2/1999 | | |
| EP | 1930962 | 6/2008 | | |
| JP | 60176282 | 9/1985 | | |
| JP | 61142780 | 6/1986 | | |
| JP | 63128683 A | * | 6/1988 | ............... 29/25.35 |
| JP | 2004352481 | 12/2004 | | |
| WO | 9740536 | 10/1997 | | |
| WO | 2005015651 | 2/2005 | | |

OTHER PUBLICATIONS

German Office Action for Application No. 10 2005 051 289.5 (3 pages), Jun. 19, 2006.

Chinese Office Action for Application No. 200680039823.9 (14 pages), Aug. 14, 2009.

International Search Report for Application No. PCT/EP2006/067612 (6 pages), Mar. 13, 2007.

* cited by examiner

METHOD OF MANUFACTURING A PIEZOELECTRIC ACTUATOR

CROSS-REFERENCE TO RELATED APPLICATIONS

This application is a continuation of U.S. patent application Ser. No. 12/091,415 filed Apr. 24, 2008 now abandoned, which is a U.S. national stage application of International Application No. PCT/EP2006/067612 filed Oct. 20, 2006, which designates the United States of America, and claims priority to German application number 10 2005 051 289.5 filed Oct. 26, 2005, the contents of which are hereby incorporated by reference in their entirety.

TECHNICAL FIELD

The present invention relates to a piezoelectric actuator, preferably of monolithic multilayer construction, and to a method for producing the same.

BACKGROUND

Piezoelectric actuators usually consist of a number of piezoelectric elements arranged in a stack. Each of these elements in its turn consists of a piezoceramic layer on both sides of which metallic electrodes are provided. If a voltage is applied to these electrodes, the piezoceramic layer reacts with a lattice distortion, which leads along a main axis to a usable length expansion. Since this in its turn amounts to less than 2 thousandth of the layer thickness along the main axis, to achieve the desired absolute length expansion a correspondingly greater layer thickness of active piezoceramic must be provided. However, as the layer thickness of the piezoceramic layer of an individual piezoelectric element increases, the voltage required for the piezoelectric element to respond also increases. To keep this within manageable limits, the thicknesses of individual elements usually lie between 20 and 200 µm. A multilayer piezoelectric actuator must therefore have a corresponding number of individual elements or layers for a desired length expansion.

Known multilayer piezoelectric actuators thus generally consist of numerous individual layers in total. To produce said actuators, piezoceramic layers are arranged alternately with electrode material to form a stack and are laminated and sintered together to form a monolithic assembly. Such a method is known for example from European patent EP 0 894 340 B1. In this patent an electrode material is printed onto piezoceramic green tapes. The printing is undertaken in accordance with a pattern, which includes printed areas and non-printed areas left free. The electrode layers are stacked alternately such that a surface printed with electrode material in the next adjacent second electrode layer is arranged over each unprinted area in a first electrode layer. The alternating arrangement means that every second electrode layer covers the same area in relation to its pattern of electrodes. In the intermediate electrode layers, which also cover the same area, the unprinted areas left free are offset diagonally.

In this approach in accordance with the prior art however the disadvantageous fact has emerged that during sintering, an internal pressure and volume equalization occurs, with for example the unprinted areas left free in the electrode pattern being completely filled by ceramic material of the adjacent ceramic layers. During an electrical contacting of the electrode layers all ceramic layers undergo an expansion, with the exception of the corner areas comprising the unprinted areas, since no effective electrical field strength can be built up in these two diagonally-opposite areas. By contrast with the rest of the ceramic areas, these corner areas thus do not experience any expansion on activation, which means that mechanical stresses occur between the active areas and the inactive areas. These mechanical stresses cause cracks to form which can start from the inactive corner areas and extend into the active ceramic areas. Such cracks can propagate in an unchecked way through the ceramic in a longitudinal direction as well and considerably reduce the service life of the piezoelectric actuator.

The process of integrating stress-relieving layers into the stack in accordance with a predetermined alternating sequence of ceramic and electrode layers in order to create predetermined separation areas to reduce mechanical stresses is known to the inventor.

In this approach however the fact that the incorporation of additional stress-relieving layers involves an additional production effort and additional production costs has proved disadvantageous. In addition these stress-relieving layers disadvantageously increase the size of the stack.

Further measures are also known to the inventor for reducing mechanical stresses in the piezoelectric actuator, which however do not prevent the formation of cracks in general but merely a formation of cracks in a longitudinal direction of the piezoelectric actuator, which means that the function of the piezoelectric actuator is largely preserved. Despite this, there is also the risk with these measures of unchecked crack propagation resulting from residual transverse cracks, which reduces the power of the piezoelectric actuator or can possibly even destroy it.

SUMMARY

A piezoelectric actuator and a production method for the same can be specified, with polarization cracks being reduced or minimized despite inactive zones in the electrode layers.

According to an embodiment, a method for producing a piezoelectric actuator, may comprise the following steps: Providing a number of layers of piezoelectric material able to be assembled into a stack; Application of electrode layers comprising a recess in each case to the number of layers of piezoelectric material such that an alternating sequence of layers of piezoelectric material and electrode layers is produced in the stack, with electrode layers being provided alternately in the stack with a recess in a first recess zone and electrode layers with a recess in a second zone differing from the first recess zone; and Provision of a stress-relieving material in the first and second recesses, which, after the stack is sintered, exhibits properties of electrical insulation and properties of preventing the adhesion of the individual material layers.

According to a further embodiment, a metallization paste containing a noble metal with a low diffusion capability of the electrically-conductive particles during sintering of the stack, for example a paste containing silver-palladium, may be printed as electrode layers onto the number of layers of piezoelectric material in each case. According to a further embodiment, a paste containing noble metals with a very high diffusion capability of the electrically-conductive particles during sintering of the stack, for example a paste containing silver, may be printed into the recesses as stress-relieving material. According to a further embodiment, ceramic green tapes may be used as layers of piezoelectric material. According to a further embodiment, each second electrode layer may be embodied in the stack with a recess in a first corner zone and each electrode layer provided between said layers may be embodied with a recess in a second corner zone lying opposite the first corner zone. According to a further embodiment, the piezoelectric actuator may be embodied with at least two holes running in a longitudinal direction, with the recesses of the first recess zone in the area of the one hole and the recesses of the second recess zone in the area of the other hole in the stack being provided in an alternating sequence, with the holes being able to be linked in each case with an electrical contacting.

According to another embodiment, a piezoelectric actuator may comprise a number of layers of piezoelectric material assembled into a stack; and electrode layers, which are applied in each case to the number of layers of piezoelectric material such that an alternating sequence of piezoelectric material layers (2) and electrode layers is produced in the stack; and electrode layers being provided with a stress-relieving recess in a first recess zone and electrode layers with a stress relieving recess in a second recess zone differing from the first recess zone alternating in the stack.

According to a further embodiment, the electrode layers may consist of a metallization paste containing a noble metal with a low diffusion capability of the electrically-conductive particles during sintering of the stack, for example made of a paste containing silver-palladium. According to a further embodiment, the number of layers of piezoelectric material may be embodied as ceramic green tapes. According to a further embodiment, each second electrode layer in the stack may feature a stress-relieving recess in a first corner area and each electrode layer provided between said layers may features a stress-relieving recess in a second corner area lying opposite the first corner area. According to a further embodiment, the piezoelectric actuator features at least two holes running in a longitudinal direction, with the recesses of the first recess zone in the area of the one hole and the recesses of the second recess zone in the area of the other holes in the stack being provided in alternating sequence, with the holes being able to be linked in each case with an electrical contacting.

BRIEF DESCRIPTION OF THE DRAWINGS

The invention is described in more detail below on the basis of the exemplary embodiments specified in the schematic figures of the drawing. The figures show.

In the figures the same reference symbols designate the same components or those with the same functions, unless stated to the contrary.

DETAILED DESCRIPTION

Figure 1:
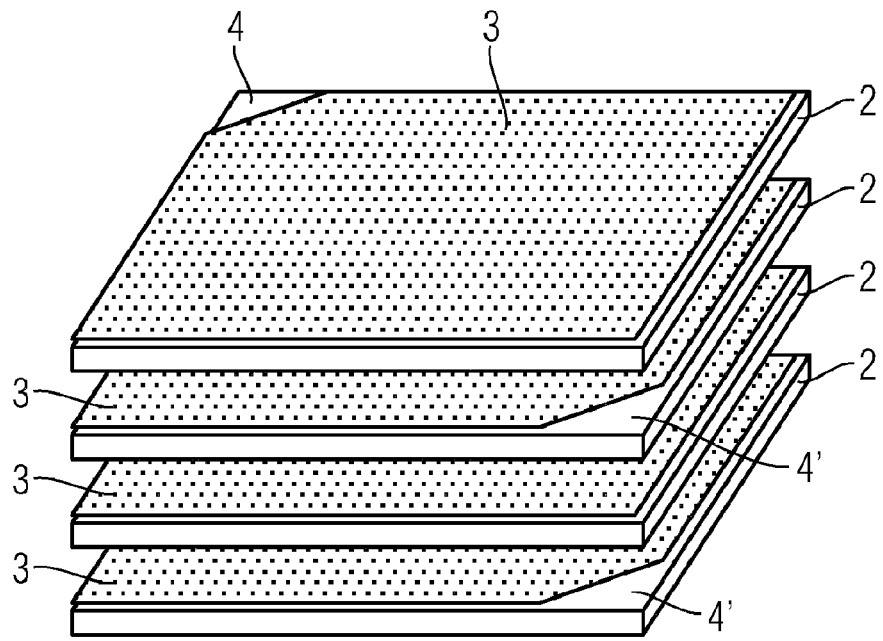
FIG. 1 an exploded view of a number of ceramic layers able to be assembled into a stack with electrode layers applied in accordance with an exemplary embodiment.

According to various embodiments, the piezoelectric actuator is constructed from a number of layers of piezoelectric material able to be assembled into a stack, with electrode layers with a recess in each case being applied to the number of layers of piezoelectric material such that in the stack an alternating sequence of layers of piezoelectric material and electrode layers is produced, with electrode layers with a recess in a first recess zone and electrode layers with a recess in a second recess zone differing from the first recess zone being provided alternately in the stack. Further a stress-relieving material is provided in the first and second recesses respectively, which exhibits electrically-insulating properties and properties which cause the individual layers of material not to adhere to each other after the stack is sintered.

The various embodiments thus have the advantage over the known approaches that the free areas or recesses of the electrode layers provided are not completely filled with ceramic material during sintering of the stack, but because of the non-adhering properties of the stress-relieving material, create a mechanical separation point or stress-relieving recess between two consecutive ceramic layers in the zone of the recesses. In the event of a diffusion of the stress-relieving material having a high diffusion capability during the sintering the separation points are embodied as hollow spaces between adjacent ceramic layers. This means that there is no adhesion between the ceramic layers in this zone, so that no significant mechanical stresses can occur in these inactive zones. The mechanical stresses—if present at all—do not expand further to form damaging cracks.

Furthermore the various embodiments have the advantage that, in the recess zones, because of the electrically-insulating properties of the stress-relieving material, electrically-insulated areas are produced, which guarantee an external metallization of the piezoelectric actuator for an electrical activation of each second electrode layer in a simple and cost-effective manner.

In addition no new technology need by introduced for producing the piezoelectric actuator according to various embodiments, for example, the widely-used and previously-known production facilities and production processes can be used with some modifications, for example, the application of the stress-relieving material to the recess zones. This means that overall damaging cracks in the ceramic layers can be prevented or minimized in a simple and cost-effective manner.

In accordance with a preferred development a metallization paste containing noble metal with low diffusion capabilities of the electrically-conductive particles is printed onto the piezoelectric material layers as electrode layers during sintering of the stack. For example a paste containing silver-palladium is used, with the proportion of palladium ensuring that the silver remains in the paste and the proportion of silver ensuring a good electrical conductivity of the paste.

In accordance with a further preferred development a paste containing noble metal with a high diffusion capability of the electrically-conductive particles is printed onto the recesses as stress-relieving material during sintering of the stack. For example a paste containing silver is used, with the silver being diffused during sintering into the adjacent electrode areas.

In accordance with a further preferred exemplary embodiment, each second electrode layer in the stack is embodied with a recess in a first corner area and each electrode layer provided between said layers is embodied with a recess in a second corner area apposite to the first corner area. In this way a cost-effective and simple external contacting can be guaranteed such that a metallization is provided over the entire longitudinal extent of the piezoelectric actuator in the corner areas, with only each second electrode layer being contacted and thus electrically activated.

In accordance with a further preferred development the piezoelectric actuator is embodied with at least two holes running in a longitudinal direction, with the first recess zone being provided in the area of one hole and the second recess zone being provided in the area of the other hole in the stack in an alternating sequence. For example the individual electrode layers can be coupled via the holes with an electrical contact such that once again only each second electrode layer is electrically contacted for each hole. The two holes typically, but not necessarily, have a relatively large diameter in the mm range since, because it is too stiff, a massive wire cannot simply be soldered in, but instead a wire featuring very fine wires (e.g. similar to a bottle brush) can be used.

The piezoelectric actuator according to various embodiments and the method of constructing it are generally independent of the materials used. Any PZT (lead-zirconate-titanate) ceramics can be used for example as piezoelectric material layers. For example so called green tapes are drawn or cast from this material, which have a thickness of for example 20 to 200 μm after drying.

After the green tapes have been dried these are provided with electrode layers, for example printed with a suitable silver-palladium paste. The paste preferably contains the particles of a silver/palladium alloy in a binder with a printable consistency overall. This screen printing paste, as well as organic aids, typically features fine-grain silver powder and palladium powder. The proportion of silver in the paste guarantees the good electrical conductivity of the electrode layer after sintering, whereas the palladium proportion guarantees that, despite the high diffusion capability of the silver at the temperature occurring during a sintering, this remains in the printed electrode layer. With a diffusion during the sintering, if palladium is present, the silver contained in the paste reaches an even distribution in concentration in the palladium. The diffusion capability of palladium is small enough for this not to require further consideration.

Figure 2:
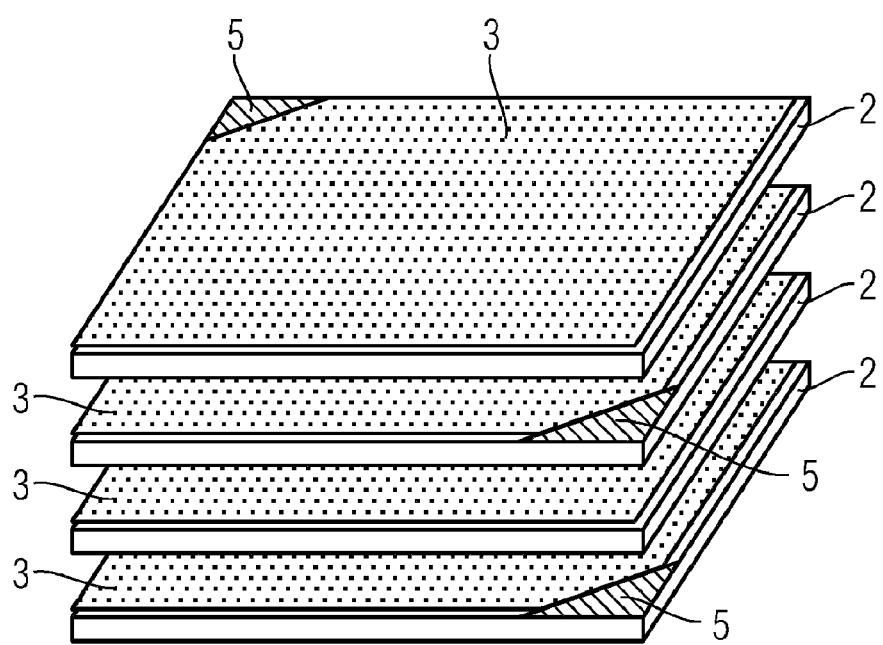
FIG. 2 the exploded view from FIG. 1 with stress-relieving material applied in the recesses in accordance with an exemplary embodiment.

FIG. 1 illustrates an exploded view of four piezoelectric ceramic layers 2, which are each printed on one side with an electrode layer 3, for example made of the silver-palladium paste described above. Although just four ceramic layers are illustrated in FIGS. 1 and 2 by way of example, it is obvious to the person skilled in the art that any number of piezoelectric ceramic layers can be connected to each other in a stack in a similar manner.

As can also be seen in FIG. 1, the ceramic layers 2 are printed in accordance with a pattern such that a printed electrode area 3 and an unprinted, recess zone 4 or 4' which remains free is provided on each ceramic layer. For example for the electrode layers 3 as much of the silver-palladium paste is printed onto one side on the assigned ceramic layers 2 for a 2-3 μm thickness of contiguous electrode layer 3 to be produced after the sintering.

The piezoceramic layers 2 printed with the electrode material are dried if necessary and subsequently stacked above one another in a suitable manner, with an alternating arrangement of piezoceramic layers 2 and electrode layers 3 being produced.

For the electrode layers 3 the stacking is likewise alternating such that over each recess 4 or 4' in a first electrode layer which corresponds to the unprinted electrode areas 4 or 4', a surface printed with electrode material is arranged in the next adjacent electrode layer, as can be seen in FIG. 1. In the exemplary embodiment shown in FIG. 1 the recesses 4 or 4' are each provided alternately in diagonally-opposite corner areas. It is however obvious for a person skilled in the art that the recesses 4 or 4' can also be provided at any other point in an alternating sequence on the ceramic layers.

The alternating arrangement means that each second layer covers the same area as regards its electrode pattern with the recesses 4 provided. In the intermediate layers likewise arranged to cover the same area the recesses 4' are arranged offset in relation to the recesses 4.

In this manner a stack is embodied from as many individual layers arranged above one another as to obtain a desired total height of the piezoelectric actuator.

Subsequently, in accordance with an exemplary embodiment, in addition to each silver-palladium printing, an additional print process is conducted in which a silver paste 5 is printed into the recesses 4 or 4', as illustrated schematically in FIG. 2. Thus only the recesses 4 or 4' of the recess zones are printed with the silver paste 5, with the further production process remaining unchanged. Consequently each layer consists of an electrode area 3 printed with a silver-palladium paste and a recess zone printed with a silver paste 5.

After a suitable orientation and stacking of the individual layers, a sintering is undertaken for example under light pressure in an oxidizing atmosphere for a predefined period and at a predefined sinter temperature, which can amount to more than 1000° C. for example. During the sintering the silver in the silver-palladium paste reaches an even distribution in concentration in the palladium through diffusion because of the presence of the palladium. This means that the silver stays in the electrode zones 3 which have a proportion of palladium.

By contrast with this, the silver in the silver paste 5 diffuses into the recesses 4 or 4' because of its high diffusion capabilities almost completely out of the recess zones 4 or 4' and into the adjacent silver-palladium electrode zones 3. Through the diffusion of the silver from the recess zones 4 or 4' into the adjacent electrode layers 3 stress-relieving recesses 6 or 6' are embodied in the areas of the recesses 4 or 4', as is indicated schematically in FIG. 3 by the broken lines.

The recess zones which include the recesses 4 or 4', because of the diffusion of the electrically-conductive silver particles, exhibit electrically-insulating or electrically non-conductive characteristics which is required for a subsequent outside contacting of only every second layer. This enables the proven and widely used contacting technology of the piezoelectric actuator to be retained unchanged.

Furthermore two adjacent electrode layers in the recess zones 4 or 4', because of the stress-relieving recesses 6 and 6' created, do not adhere to each other in this area, since in accordance with the present exemplary embodiment in each of the two diagonally-opposite corner areas after each second layer a separation point occurs caused by the diffused-out silver paste. Consequently no significant mechanical stresses can arise between the inactive recess zones 4 or 4' and the active areas featuring the electrode layers 3 of the piezoceramic during a polarization of the piezoelectric actuator 1.

Figure 3:
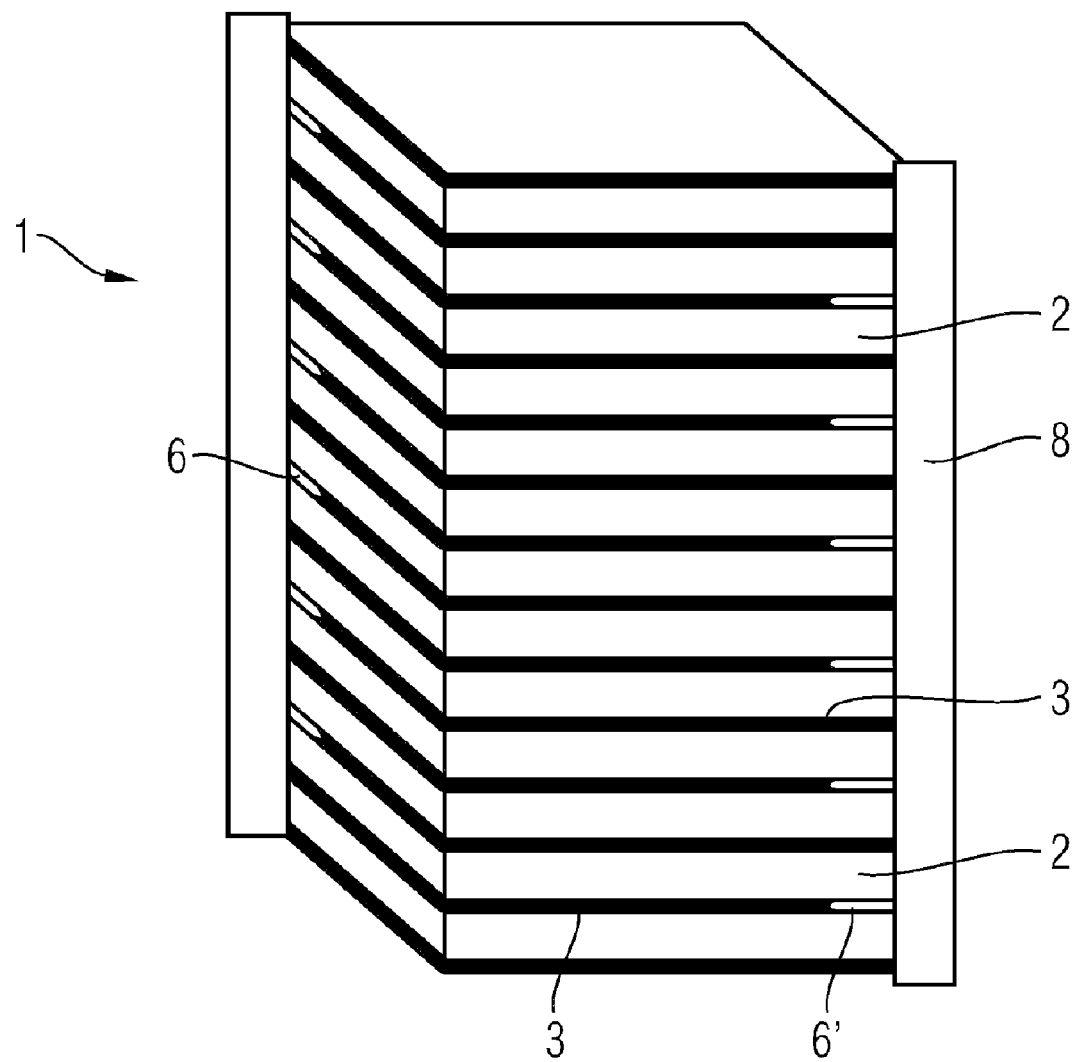
FIG. 3 a perspective view of a piezoelectric actuator in assembled monolithic multilayer construction in accordance with an exemplary embodiment.

FIG. 3 illustrates a perspective view of a finished piezoelectric actuator 1, which is contacted in the form of strips with an external metallization 8 for electrical contacting at corners opposite one another. Because of the electrode structure which alternates from individual layer to individual layer this type of external contact 8 only reaches every second electrode layer, whereas the external contact 8 attached at the opposite edge contacts the intermediate electrode layers in each case. This means that an electrically-parallel wiring of the piezoelectric layers of material lying between the electrode layers is possible, which allows an optimum operation of the piezoelectric actuator 1.

The present invention thus creates a piezoelectric actuator and a method for producing the same, with, because of the separation points or stress-relieving recesses obtained during the sintering in the areas of the recesses 4 or 4', electrically non-conductive areas as well as mechanically stress-relieving zones to prevent mechanical stresses are obtained. The inventive method guarantees that no new technology need be introduced and no new production facilities are necessary. Furthermore because of the use of the silver paste and the silver-palladium paste, no new connections or elements are introduced into the chemical system of the piezoelectric actuator, which could lead to unknown effects. Furthermore silver is cost effective compared to palladium, so that additional material costs are insignificant. The additional screen printing process to print on the silver paste is simple and cost effective to undertake compared to additional production steps with previous measures for avoiding cracks.

Although the present invention has been described here on the basis of preferred exemplary embodiments, it is not restricted to them but is able to be modified in numerous ways.

For example, instead of the silver-palladium paste, another metallization paste containing noble metals can be used with a low diffusion capability of the electrically-conductive particles during sintering of the stack. Furthermore another paste containing noble metals or another suitable stress-relieving material with a very high diffusion capability of the electrically-conductive particles during sintering of the stack can also be used instead of the silver paste as stress-relieving material. Generally any stress-relieving material which guarantees a non-conductive area in the recess zones and prevents an adhesion between adjacent layers is suitable for forming a stress-relieving recess or a stress-relieving area.

Furthermore the recess zones, instead of being provided at diagonally opposite corner areas, can also be provided within the layer surface, for example such that drilled holes run in the longitudinal direction of the piezoelectric actuator through the individual recess pattern in each case. This advantageously enables contacting to be laid from the outside of the piezoelectric actuator to the inside. For example suitable contacting means are inserted into the at least two holes so that once again each second electrode layer is electrically contacted and the intermediate layers are not contacted because of the recess zones provided. In addition adjacent layers in these recess zones do not adhere to each other because of the stress-relieving recesses.

The invention claimed is:

1. A method for producing a piezoelectric actuator, comprising the following steps:
    applying a layer of metallization paste to each of a plurality of layers of piezoelectric material, the metallization paste including a noble metal with a low diffusion capability of electrically-conductive particles,
    the layers of metallization paste include a number of first metallization paste layers and a number of second metallization paste layers each first metallization paste layer having a recess in a first recess zone and each second metallization paste layer having a recess in a second zone differing from the first recess zone;
    applying a high diffusion paste containing noble metals with a very high diffusion capability of electrically-conductive particles in each of the first and second recesses;
    stacking the piezoelectric material layers such that the first metallization paste layers and the second metallization paste layers are arranged alternatively in a stack; and
    sintering the stack to cause:
        (a) the metallization paste in each metallization paste layer to form an electrode layer due to the lower diffusion capability of the electrically-conductive particles in the metallization paste, and
        (b) the high diffusion paste in each of the first and second recesses to form stress-relieving insulation areas due to the very high diffusion capability of the electrically-conductive particles in the high diffusion paste, the stress-relieving insulation areas exhibiting properties of electrical insulation and properties of preventing the adhesion of adjacent piezoelectric material layers in the stack.

2. The method according to claim 1, wherein ceramic green tapes are used as the layers of piezoelectric material.

3. The method according to claim 1, wherein the recess of each first metallization paste layer is located in a first corner zone and the recess of each second metallization paste layer is located in a second corner zone lying opposite the first corner zone.

4. The method according to claim 1, wherein the piezoelectric actuator is embodied with at least two holes running in a longitudinal direction, including a first hole extending through the recesses in the first recess zones and a second hole extending through the recesses in the second recess zones; and
    inserting a first electrical contact through the first hole and inserting a second electrical contact through the second hole.

5. The method according to claim 1, wherein the metallization paste comprises silver-palladium.

6. The method according to claim 1, wherein the high diffusion paste comprises silver.

* * * * *